(12) United States Patent
Gat

(10) Patent No.: US 6,727,474 B2
(45) Date of Patent: Apr. 27, 2004

(54) RAPID THERMAL PROCESSING CHAMBER FOR PROCESSING MULTIPLE WAFERS

(75) Inventor: Arnon Gat, Palo Alto, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/943,928

(22) Filed: Aug. 31, 2001

(65) Prior Publication Data

US 2002/0005400 A1 Jan. 17, 2002

Related U.S. Application Data

(63) Continuation of application No. 09/759,426, filed on Jan. 12, 2001, and a continuation of application No. 09/208,958, filed on Dec. 10, 1998, now Pat. No. 6,310,328.

(51) Int. Cl.⁷ .................................................. F27B 5/14
(52) U.S. Cl. ........................ 219/390; 219/405; 219/411; 392/416; 392/418; 118/724; 118/725; 250/492.22
(58) Field of Search ................................. 219/390, 405, 219/411; 392/416, 418; 118/724, 725, 50.1, 715, 728, 729; 250/492.22; 362/297, 298, 301; 427/248.1

(56) References Cited

U.S. PATENT DOCUMENTS

| | | |
|---|---|---|
| 3,623,712 A | 11/1971 | McNeilly et al. |
| 3,796,182 A | 3/1974 | Rosler |
| 3,830,194 A | 8/1974 | Benzing et al. |
| 3,836,751 A | 9/1974 | Anderson |
| 3,862,397 A | 1/1975 | Anderson et al. |
| 4,047,496 A | 9/1977 | McNeilly et al. |
| 4,081,313 A | 3/1978 | McNeilly et al. |
| 4,101,759 A | 7/1978 | Anthoney, et al. |
| 4,221,956 A | 9/1980 | Fielding et al. |
| 4,224,504 A | 9/1980 | Erikson et al. |

(List continued on next page.)

FOREIGN PATENT DOCUMENTS

| | | |
|---|---|---|
| EP | 0328817 | 8/1989 |
| EP | 0468874 | 1/1992 |
| EP | 0505928 | 9/1992 |
| JP | 5648128 | 5/1981 |
| JP | 60010615 | 1/1985 |
| JP | 60153116 | 8/1985 |
| JP | 61199631 | 9/1986 |
| JP | 6294925 | 5/1987 |
| JP | 5326434 | 12/1993 |
| JP | 653223 | 2/1994 |
| JP | 08288296 | 11/1996 |

OTHER PUBLICATIONS

International Search Report Dated May 2, 2000 for International Patent No. 99/01946 Filed Dec. 12, 1999 Entitled "Infrared Lamp Annealer".

*Primary Examiner*—Shawntina Fuqua
(74) *Attorney, Agent, or Firm*—Dority & Manning, P.A.

(57) ABSTRACT

A system for heating a plurality of semiconductor wafers at the same time is disclosed. the apparatus includes a thermal processing chamber containing a substrate holder designed to hold from about three to about ten wafers. The thermal processing chamber is surrounded by light energy sources which heat the wafers contained in the chamber. The light energy sources can heat the wafers directly or indirectly. In one embodiment, the thermal processing chamber includes a liner made from a heat conductive material. The light energy sources are used to heat the liner which, in turn, heats the wafers. In an alternative embodiment, energy dispersing plates are placed in between adjacent wafers. Light energy being emitted by the light energy sources enters the energy dispersing members and gets distributed across the surface of adjacent wafers for heating the wafers uniformly.

40 Claims, 5 Drawing Sheets

U.S. PATENT DOCUMENTS

| | | | |
|---|---|---|---|
| 4,421,786 A | * 12/1983 | Mahajan et al. | 427/82 |
| 4,544,418 A | 10/1985 | Gibbons | |
| 4,558,660 A | 12/1985 | Nishizawa et al. | |
| 4,680,451 A | 7/1987 | Gat et al. | |
| 4,745,088 A | * 5/1988 | Inoue et al. | 437/102 |
| 4,820,377 A | 4/1989 | Davis et al. | |
| 4,830,700 A | 5/1989 | Davis et al. | |
| 4,832,777 A | 5/1989 | Davis et al. | |
| 4,832,778 A | 5/1989 | Davis et al. | |
| 4,911,103 A | 3/1990 | Davis et al. | |
| 4,926,793 A | * 5/1990 | Arima et al. | 117/730 |
| 4,950,870 A | 8/1990 | Mitsuhashi, et al. | |
| 5,053,247 A | 10/1991 | Moore | |
| 5,155,336 A | 10/1992 | Gronet, et al. | |
| 5,245,158 A | 9/1993 | Hashizume, et al. | |
| 5,259,881 A | 11/1993 | Edwards et al. | |
| 5,317,492 A | 5/1994 | Gronet et al. | |
| 5,364,667 A | 11/1994 | Rhieu | |
| 5,380,682 A | 1/1995 | Edwards et al. | |
| 5,418,885 A | * 5/1995 | Hauser et al. | 392/416 |
| 5,444,217 A | 8/1995 | Moore et al. | |
| 5,452,396 A | 9/1995 | Sopori | |
| 5,487,127 A | 1/1996 | Gronet, et al. | |
| 5,505,779 A | 4/1996 | Mizuno et al. | |
| 5,534,072 A | 7/1996 | Mizuni, et al. | |
| 5,683,173 A | 11/1997 | Gronet, et al. | |
| 5,689,614 A | 11/1997 | Gronet et al. | |
| 5,743,967 A | * 4/1998 | Kobori et al. | 118/724 |
| 5,763,856 A | 6/1998 | Ohkase | |
| 5,837,555 A | 11/1998 | Kaltenbrunner, et al. | |
| 5,850,071 A | * 12/1998 | Makiguchi et al. | 219/390 |
| 5,855,681 A | 1/1999 | Maydan, et al. | |
| 5,859,071 A | 1/1999 | Young, et al. | |
| 5,872,889 A | 2/1999 | Kaltenbrunner, et al. | |
| 5,960,159 A | 9/1999 | Ikeda, et al. | |
| 6,015,512 A | 1/2000 | Yang, et al. | |
| 6,051,512 A | * 4/2000 | Sommer et al. | 438/795 |
| 6,225,602 B1 | * 5/2001 | Buijze et al. | 219/390 |

* cited by examiner

US 6,727,474 B2

RAPID THERMAL PROCESSING CHAMBER FOR PROCESSING MULTIPLE WAFERS

RELATED APPLICATIONS

The present application is a Continuation Application of U.S. Ser. No.: 09/759,426 filed on Jan. 12, 2001 and is also a continuation of U.S. Ser. No. 09/208,958 filed on Dec. 10,1998 is now U.S. Pat. No. 6,310,328.

FIELD OF THE INVENTION

The present invention is generally directed to rapid thermal processing chambers for heating semiconductor wafers using light energy. More particularly, the present invention is directed to rapid thermal processing chambers that are capable of processing a plurality of wafers at the same time.

BACKGROUND OF THE INVENTION

Various heating devices have been proposed in the past for processing semiconductor wafers. These heating devices can be classified into two basic configurations. The first is a batch system in which multiple wafers (25 wafers to about 200 wafers) are loaded into a round tubular furnace and slowly heated to the desired temperature. Batch systems can be considered temperature equilibrium devices in that the furnace walls are approximately at the same temperature as the heating elements and the wafers being heated. Batch systems are typically referred to as "hot wall" systems since the furnace walls are at an elevated temperature. The primary advantage of a batch system is the ability to process many wafers at the same time therefore reducing the processing cost per wafer. The disadvantage of such a configuration, however, is the speed in which the wafer temperature can be elevated or cooled. The large thermal mass of a batch furnace prevents quick temperature changes and forces relatively long process times, ranging from about fifteen minutes to about five hours.

A second and newer approach to wafer heating is rapid thermal processing where a single wafer is heated in a small compartment using radiant energy as the energy source. For instance, such systems typically include a substrate holder for holding a semiconductor wafer and a light source that emits light energy for heating the wafer. During heat treatment, the semiconductor wafer is heated under controlled conditions according to a preset temperature regime. For monitoring the temperature of the semiconductor wafer during heat treatment, rapid thermal processing chambers also typically include temperature sensing devices, such as pyrometers, that sense the radiation being emitted by a semiconductor wafer at a selected band or wavelength. By sensing the thermal radiation being emitted by the wafer, the temperature of the wafer can be calculated with reasonable accuracy.

In alternative embodiments, instead of or in addition to using radiation sensing devices, rapid thermal processing chambers can also contain thermocouples for monitoring the temperature of the wafers. Thermocouples measure the temperature of objects by direct contact.

Many semiconductor heating processes require a wafer to be heated to high temperatures so that various chemical and physical reactions can take place as the wafer is fabricated into a device. During rapid thermal processing, semiconductor wafers are typically heated by arrays of lights to temperatures, for instance, from about 400° C. to about 1,200° C., for times which are typically less than a few minutes and in most cases less than one minute.

Rapid thermal processing chambers typically operate in a non-equilibrium state. Specifically, the walls surrounding the wafer are kept cool, with active cooling, and thus are typically referred to as "cold wall" systems. The non-equilibrium configuration refers to the fact that the filament temperature inside the radiant source is at a much higher temperature than the wafer. The key advantage of using rapid thermal processing systems is the ability to quickly change wafer temperature therefore enabling very short heating cycles which can be between about one second to about two minutes. The drawback of rapid thermal processing systems, however, is the cost per wafer processed, especially for cycles between 60 and 120 seconds long, since the systems are only equipped to heat one wafer at a time.

In view of the above, a need currently exists for a thermal processing chamber that is capable of rapidly heat treating a plurality of wafers at the same time. Specifically, a need exists for a thermal processing chamber capable of accommodating a plurality of wafers as in a batch system, but yet also capable of processing the wafers very rapidly, such as in a rapid thermal processing system.

SUMMARY OF THE INVENTION

The present invention recognizes and addresses the foregoing disadvantages and others of prior art constructions and methods.

Accordingly, it is an object of the present invention to provide an improved thermal processing chamber for heat treating semiconductor wafers.

Another object of the present invention is to provide a thermal processing chamber that is capable of heat treating a plurality of wafers at the same time.

Still another object of the present invention is to provide a multiwafer thermal processing chamber that heats the wafers using light energy.

Another object of the present invention is to provide a multiwafer thermal processing system that rapidly processes a plurality of semiconductor wafers in a "cold wall" chamber.

These and other objects of the present invention are achieved by providing a multiwafer thermal processing system. The system includes a thermal processing chamber adapted to receive a plurality of stacked semiconductor wafers. A plurality of light energy sources are placed in communication with the thermal processing chamber for the heating semiconductor wafers contained in the chamber. Specifically, the plurality of light energy sources are positioned so as to encircle the thermal processing chamber. Light energy sources can also be placed at the top and at the bottom of the chamber if desired.

A substrate holder is contained within the thermal processing chamber. The substrate holder is configured to hold the plurality of semiconductor wafers. In particular, the wafers are held in a stacked arrangement wherein adjacent wafers are spaced a distance sufficient for light energy being emitted by the light energy sources to contact the entire bottom and top surfaces of the wafers.

In one embodiment, the system further includes at least one temperature sensing device for monitoring the temperature of the semiconductor wafers. For instance, the temperature sensing devices can be pyrometers, thermocouples or a combination of pyrometers and thermocouples. A controller, such as a microprocessor is placed in communication with the temperature sensing devices and the light energy sources. The controller is configured to control the amount of light energy being emitted by the light energy sources in response to temperature information received from the temperature sensing devices. In this manner, the wafers can be heated uniformly and according to a preset temperature regime.

The system of the present invention is capable of heating a plurality of semiconductor wafers (from 2 to 10 wafers) to a temperature range from 200° C. to 1,200° C. The system is capable of heating wafers to the above described temperatures in a very short period of time, such as from about one minute to about five minutes.

For most applications, the light energy sources should be positioned outside of the thermal processing chamber so the light energy sources do not contaminate wafers contained in the chamber. In one embodiment, the thermal processing chamber can include one or more windows designed to allow light energy being emitted by the light energy sources to pass into the chamber.

The light energy sources used in the system of the present invention can have various shapes and can be positioned around the thermal processing chamber at various locations and according to various patterns. In one embodiment, the light energy sources can comprise lamps having an elongated housing. The lamps can be positioned such that the elongated housing faces the thermal processing chamber. The lamps can be placed around the thermal processing chamber so that the elongated housing is parallel to a vertical axis of the chamber. Alternatively, the lamps can be placed perpendicular to the vertical axis of the chamber. Preferably, the system includes reflectors positioned behind the light energy sources. The reflectors can be used to direct light energy being emitted by the light energy sources into the thermal processing chamber.

In an alternative embodiment of the present invention, instead of the light energy sources directly heating the semiconductor wafers, the light energy sources can be used to heat a thermally conductive lining which in turn heats the wafers. For instance, the thermal processing system of the present invention can contain a lining that is positioned so as to surround semiconductor wafers held on the substrate holder in the thermal processing chamber. The lining can be in the shape of a cylindrical sleeve that can have a top and a bottom for completely enclosing the substrate holder and the wafers. The thermally conductive lining can be made from various materials including, for instance, silicon carbide.

In this embodiment, in order to monitor the temperature of the wafers during processing, one or more temperature sensing devices can be used to sense the temperature of the thermally conductive lining. The system can be calibrated such that the temperature of the wafers contained within the thermal processing chamber can be determined by knowing the temperature of the lining.

In a further alternative embodiment of the present invention, the multiwafer thermal processing system can include energy dispersing members located within the thermal processing chamber for distributing light energy being emitted by the light energy sources onto the semiconductor wafers. For instance, in one embodiment, the energy dispersing members can be in the shape of plates spaced in between semiconductor wafers held within the chamber. Light energy sources can be positioned to emit light energy directly into the energy dispersing members. The energy dispersing members can redirect the light energy onto the adjacent wafers.

The energy dispersing members can be made from various materials and can have any shape sufficient to refract and disperse light. In one embodiment, the energy dispersing members can be quartz plates containing areas having a different index of refraction than the quartz. For instance, the areas having a different index of refraction can be made from glass particles, such as glass spheres.

In an alternative embodiment, the energy dispersing members can be quartz plates having a shape that is designed to refract light. For instance, sharp angles can be formed into the quartz plate which cause light energy in the plate to be scattered in various directions. Preferably, light energy sources are positioned adjacent the side surfaces of each of the energy dispersing members. In this manner, light energy directly enters the dispersing members and is distributed to adjacent wafers. In order to maximize the amount of light energy that enters the light dispersing members, reflectors can also be placed around the light energy sources.

Other objects, features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Repeat use of references characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

In general, the present invention is directed to a thermal processing system capable of heat treating a plurality of semiconductor wafers at the same time. The system can be designed to heat the semiconductor wafers very quickly, at a controlled rate, and can also heat the wafers substantially uniformly. The system includes a thermal processing chamber in communication with a heating device that is used to heat treat the semiconductor wafers contained in the chamber. The heating device contains a plurality of light energy sources, such as lamps, that are positioned so as to surround the thermal processing chamber for heating the wafers. According to the present invention, the lamps can be used to directly heat the semiconductor wafers or can be used to indirectly heat the semiconductor wafers.

During heating, the semiconductor wafers are held on a substrate holder. The substrate holder is designed to hold the wafers in a stacked arrangement. For most applications, the wafers should be positioned so that a space is present in between adjacent wafers.

The system of the present invention can further include a method of monitoring the temperature of the wafers during heat treating. For instance, temperature sensing devices such as pyrometers and/or thermocouples can be placed within the system at various locations. The temperature sensing devices can be used to monitor the temperature of the wafers directly or can be used to monitor the temperature of an object in the chamber which can be used to determine the temperature of the wafers. In one embodiment, based upon the temperature being sensed during processing, the energy being emitted by the lamps can be selectively controlled for maintaining the wafers at a substantially constant temperature and for heating the wafers according to a preset pattern.

Figure 1:
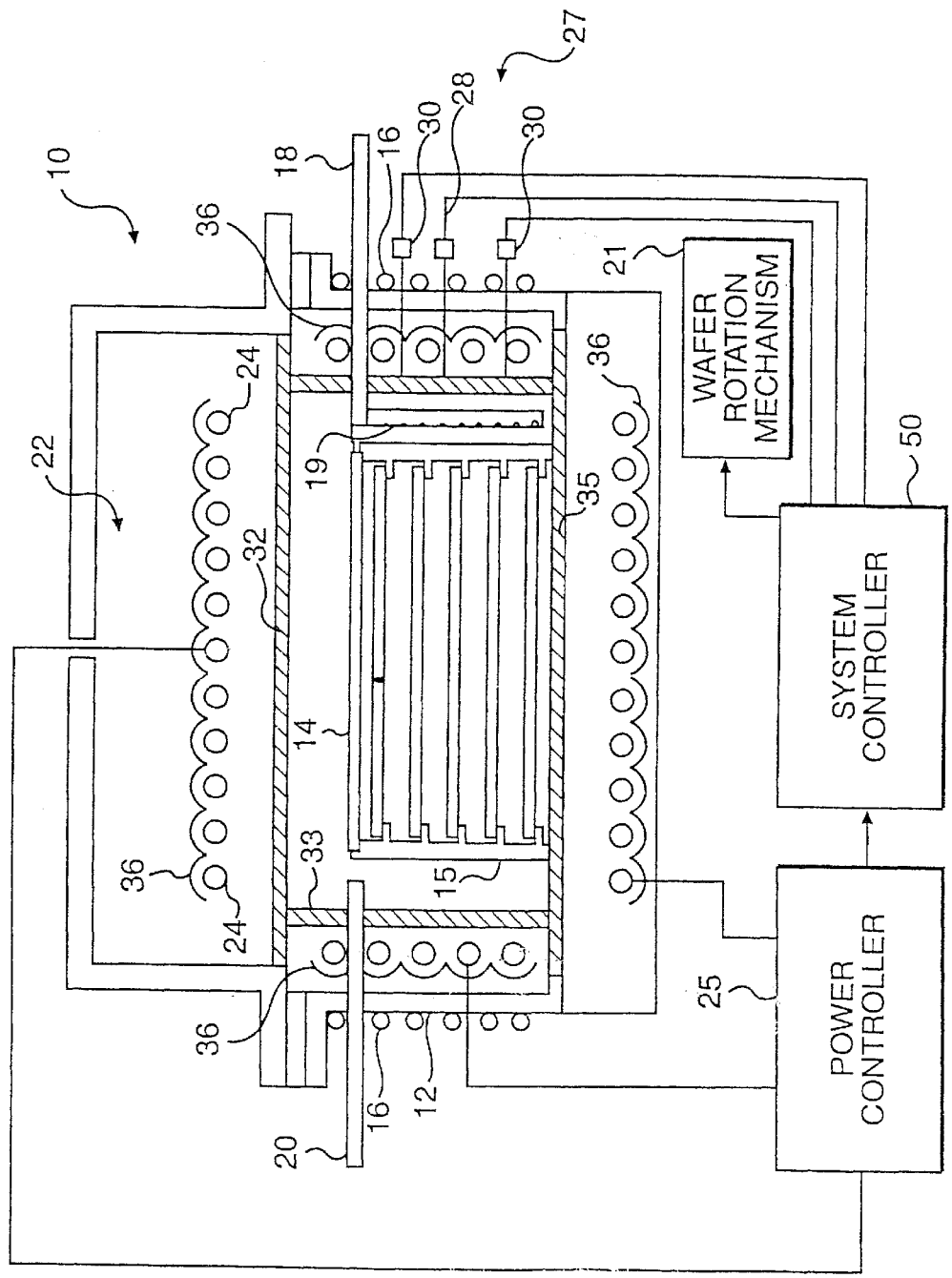
FIG. 1 is a cross-sectional, diagrammatical view of one embodiment of a multiwafer thermal processing system made in accordance with the present invention.

Referring to FIG. 1, a system generally 10 made in accordance with the present invention for heat treating a plurality of semiconductor wafers simultaneously is illustrated. System 10 includes a processing chamber 12 adapted to receive a plurality of wafers 14 for conducting various processes. Wafers 14 can be made from various materials such as silicon. Wafers 14 can be placed in chamber 12 in order to anneal the wafers or to form coatings on the wafers by reacting the wafers with a gas being circulated through the chamber. As shown, wafers 14 are positioned on a substrate holder 15 made from a thermal insulating material such as quartz. Chamber 12 is designed to heat wafers 14 at very rapid rates and under carefully controlled conditions. Chamber 12 can be made from various materials, including metals and ceramics. For instance, chamber 12 can be made from stainless steel or quartz.

When chamber 12 is made from a heat conductive material, preferably the chamber includes a cooling system. For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a constant temperature.

Chamber 12 can also include a gas inlet 18 and a gas outlet 20 for introducing a gas into the chamber and/or for maintaining the chamber within a preset pressure range. As shown, in this embodiment, gas inlet 18 includes a spray nozzle 19 defining a plurality of openings. Spray nozzle 19 is for evenly distributing the gas across the surface of the wafers. In one embodiment, a gas can be introduced into chamber 12 through gas inlet 18 for reaction with wafers 14. Once processed, the gas can then be evacuated from the chamber using gas outlet 20.

Alternatively, an inert gas can be fed to chamber 12 through gas inlet 18 for preventing any unwanted or undesirable side reactions from occurring within the chamber. In a further embodiment, gas inlet 18 and gas outlet 20 can be used to pressurize chamber 12. A vacuum can also be created in chamber 12 when desired, using gas outlet 20 or an additional larger outlet positioned beneath the level of the wafer.

As shown, substrate holder 15 is designed to hold the wafers in a stacked arrangement. In the embodiment illustrated in FIG. 1, substrate holder 15 is designed to maintain a determined distance between adjacent wafers. The wafers are spaced a distance sufficient to allow light energy and gases entering the chamber to distribute uniformly over the wafers. Specifically, it is important that each of the wafers be contacted with light energy across their entire surface so that the wafers can be heated quickly and uniformly. For most applications, the wafers should be spaced between about ¼ inch to about 1.0 inch apart. The actual distance between the wafers, however, will depend upon the size of the wafers and the amount of light energy entering the chamber.

During processing, substrate holder 15, in one embodiment, can be adapted to rotate wafers 14 using a wafer rotation mechanism 21. Rotating the wafers promotes greater temperature uniformity over the surface of the wafers and promotes enhanced contact between wafers 14 and any gases introduced into the chamber.

A heat source or heating device generally 22 is included in communication with chamber 12 for heating wafers 14 during processing. As described above, heating device 22 is preferably made up of a plurality of lamps 24, such as tungsten-halogen lamps. As shown in the embodiment illustrated in FIG. 1, lamps 24 completely encircle thermal processing chamber 12. Lamps 24 are also positioned at the top of the chamber and at the bottom of the chamber. In general, it is preferred that the system of the present invention include many lamps in order to heat the plurality of wafers 14 rapidly and in order to provide controls for heating the wafers uniformly.

The use of lamps 24 as a heat source is generally preferred. For instance, lamps have much higher heating and cooling rates than other heating devices, such as electrical elements or conventional furnaces. Lamps 24 create a rapid processing system that provide instantaneous energy, typically requiring a very short and well controlled start up period. The flow of energy from lamps 24 can also be abruptly stopped at any time. As shown in the figure, lamps 24 can be connected to a gradual power controller 25 that can be used to increase or decrease the light energy being emitted by any of the lamps or any group of lamps.

In order to assist in directing the light energy being emitted by lamps 24 into chamber 12 and onto wafers 14, preferably the lamps are associated with reflectors 36. For instance, as shown in FIG. 1, a set of reflectors 36 can be positioned behind the lamps which reflect light energy being emitted by the lamps towards the semiconductor wafers. Reflectors 36 can be in the shape of reflective annular recesses that surround a portion of lamps 24 or that are in the shape of light pipes that completely surround the lamps and extend beyond the length of the lamps.

The lamps that are used in the system of the present invention can have various shapes and can be positioned in various different configurations surrounding the thermal processing chamber. For example, in one embodiment, the lamps surrounding the sides of the chamber have an elongated tubular housing that are positioned such that the elongated housing faces the thermal processing chamber. For instance, two different configurations illustrating lamps of this type are shown in FIGS. 2 and 3.

Figure 2:
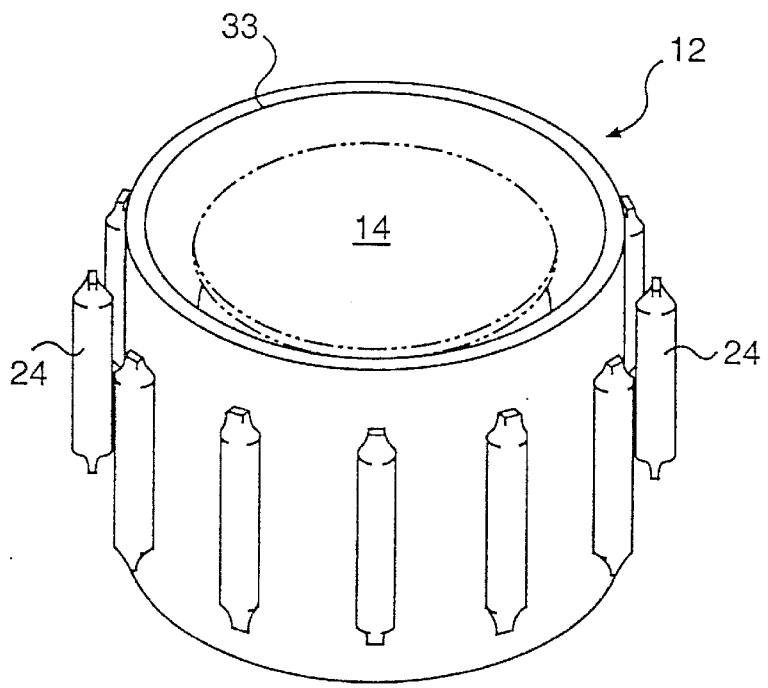
FIG. 2 is a perspective view of one embodiment of a lamp configuration that can be used in the thermal processing system of the present invention.

Referring to FIG. 2, thermal processing chamber 12 is shown surrounded by a plurality of lamps 24. In this embodiment, lamps 24 are vertically oriented with respect to the chamber or, in other words, are positioned parallel to the central axis of the chamber.

Figure 3:
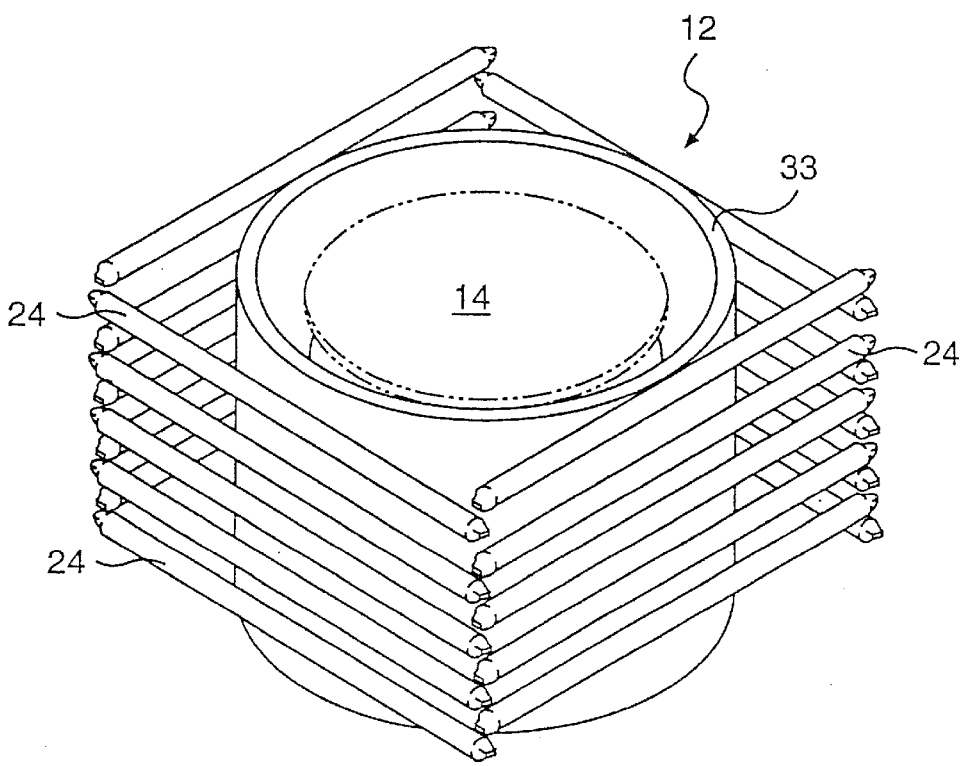
FIG. 3 is a perspective view of an alternative embodiment of a lamp configuration for use in thermal processing systems of the present invention.

In the embodiment shown in FIG. 3, on the other hand, lamps 24 are horizontally positioned with respect to thermal processing chamber 12. More particularly, lamps 24 as shown in FIG. 3 are assembled in an interlocking stacked arrangement that forms the shape of a square. Thermal processing chamber 12 containing wafers 14 is positioned within the square.

It should be understood, however, that besides the arrangements illustrated in FIGS. 2 and 3, lamps 24 can also be positioned in various other arrangements and configurations. For instance, in one embodiment, annular lamps can be formed that encircle thermal processing chamber 12.

Besides lamps having an elongated housing, shorter upright lamps may also be used, especially for being placed on the top and at the bottom of the thermal processing chamber. An upright lamp refers to a shorter lamp having a free open end opposite an end that is adapted to be placed into a socket. When incorporated into the system of the present invention, such lamps can be positioned such that the open free end faces the thermal processing chamber. Upright lamps are better adapted to focusing high intensity light onto a particular area. The elongated lamps shown in FIGS. 2 and 3, however, are well suited to exposing large areas to high intensity light.

In order to monitor the temperature of wafers 14 during the heating process, in the embodiment shown in FIG. 1, thermal processing chamber 12 includes plurality of radiation sensing devices generally 27. Radiation sensing devices 27 include a plurality of optical fibers or light pipes 28 which are, in turn, in communication with a plurality of corresponding light detectors 30. Optical fibers 28 are configured to receive thermal energy being emitted by corresponding wafers 14 at a particular wavelength. The amount of sensed radiation is then communicated to light detectors 30 which generate a usable voltage signal for determining the temperature of the wafer which can be calculated based, in part, on Planck's Law.

Preferably, optical fibers 28 can be positioned so that they receive a direct measurement of the amount of thermal energy being emitted by wafers 14. Since the wafers are stacked in the system of the present invention, however, it may be difficult to position optical fibers 28 to receive a direct measurement of the wafers. If this is the case, however, the wafer temperature can be calculated from a glancing angle measurement.

In one embodiment, each optical fiber 28 in combination with a light detector 30 comprises a pyrometer. In another embodiment, the optical fibers 28, are routed to a single but multiplexing radiation sensing device.

In general, thermal processing chamber 12 can contain one or a plurality of radiation sensing devices. In a preferred embodiment, as shown in FIG. 1, thermal processing chamber 12 contains a plurality of radiation sensing devices that measure the temperature of each of the wafers. Knowing the temperature of each of the wafers can then be used to control the amount of heat being applied to the wafers as will be described in more detail hereinafter.

In one preferred embodiment of the present invention, system 10 should be designed such that lamps 24 are separated from the interior of the thermal processing chamber. In this regard, system 10 includes a top window 32, a bottom window 35, and a cylindrical window 33, as particularly shown in FIGS. 2 and 3. Windows 32, 35 and 33 are made from a transparent material that allows light energy being emitted by lamps 24 to heat wafers 14, while creating a sealed chamber in order to prevent the wafers from being contaminated by the lamps or from any other source.

In one embodiment, windows 32, 33 and 35 can also act as a filter in preventing thermal radiation being emitted by lamps 24 at the wavelength at which light detectors 30 operate from entering thermal processing chamber 12. For example, in one embodiment, windows 32, 33 and 35 can be made from fused silica or quartz. Fused silica is known to absorb thermal radiation very effectively at selected wavelengths. For instance, synthetic fused silica with high concentration of OH ions is very effective at absorbing light at a wavelength of from approximately 2.7 micrometers to about 2.8 micrometers. Thus, in one embodiment, when windows 32, 33 and 35 are made from synthetic fused silica, light detectors 30 can be configured to detect thermal radiation being emitted by wafers 14 at a wavelength of about 2.7 micrometers.

In other embodiments, however, the separation between radiation arriving to the sensors from the wafer and lamps is achieved by mechanical means of isolation. In these embodiments, buffers and shields are present to prevent a direct path from forming between a light source and a sensing port.

Besides using radiation sensing devices, other temperature sensing devices may be used in the system of the present invention. For instance, one or more thermocouples may be incorporated into the system for monitoring the temperature of the wafers at a single location or at a plurality of locations. The thermocouples can be placed in direct contact with the wafers or can be placed adjacent the wafers from which the temperature can be extrapolated. For example, in one embodiment, thermocouples can be incorporated into substrate holder 15 for monitoring the temperature of the wafers.

System 10 further includes a system controller 50 which can be, for instance, a microprocessor. Controller 50 receives voltage signals from light detectors 30 that represent the radiation amounts being sampled at the various locations. Controller 50 can also be connected to any thermocouples contained within the system for receiving temperature information. Based on the signals received, controller 50 is configured to calculate the temperature of wafers 14 at one or more locations.

System controller 50 as shown in FIG. 1 can also be in communication with lamp power controller 25. In this arrangement, controller 50 can determine the temperature of wafers 14, and, based on this information, control the amount of thermal energy being emitted by lamps 24. For instance, controller 50 can control all of the lamps together, can individually control the lamps, or can control the lamps in selected groups. In this manner, instantaneous adjustments can be made regarding the conditions within reactor 12 for processing wafers 14 within carefully controlled limits.

In one embodiment, controller 50 can also be used to automatically control other elements within the system. For instance, controller 50 can be used to control the flow rate of gases entering chamber 12 through gas inlet 18. As shown, controller 50 can further be used to control the rate at which wafers 14 are rotated within the chamber.

Figure 4:
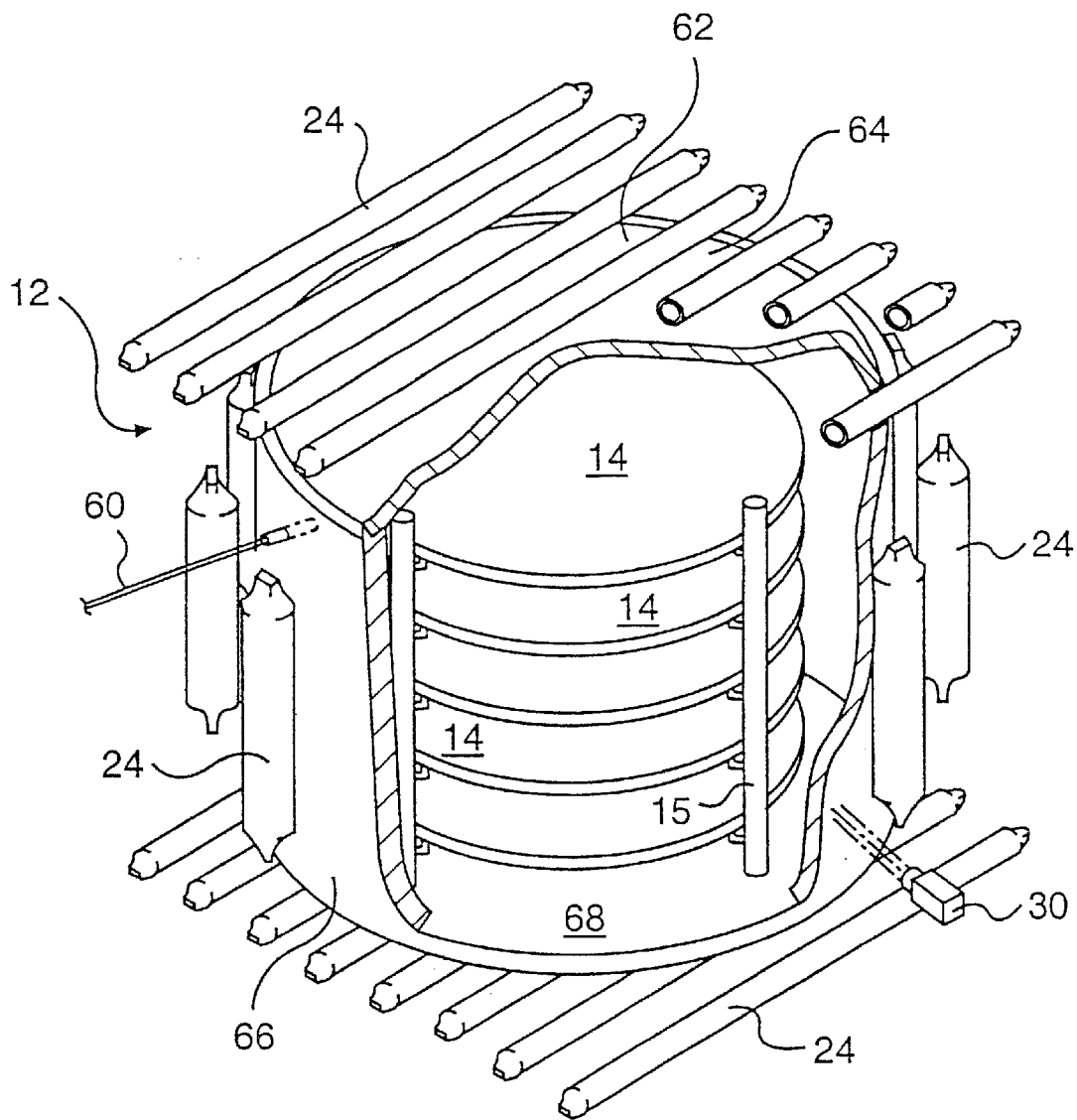
FIG. 4 is a perspective view of an alternative embodiment of a thermal processing system made in accordance with the present invention.

Referring to FIG. 4, an alternative embodiment of a thermal processing chamber 12 for use in the heating system of the present invention is illustrated. In this embodiment, chamber 12 includes a lining 62 made from an opaque heat conductive material. Lining 62 includes a top 64, a bottom 68, and a cylindrical sleeve 66 which serve to completely surround wafers 14 held on substrate holder 15. In this embodiment, lamps 24 are used to heat lining 62 which in turn heats wafers 14. Thus, the wafers are heated indirectly.

Lining 62 of thermal processing chamber 12 can be made from various materials. In one preferred embodiment for instance, lining 62 is made from silicon carbide. In another preferred embodiment it is made from a polysilicon material.

In order to monitor the temperatures of wafers 14 during heating the system illustrated in FIG. 4 can include temperature devices which directly measure the temperature of the wafers 14 during processing, similar to the temperature devices illustrated in FIG. 1.

Alternatively, the temperature of wafers 14 can be determined and calculated by measuring the temperature of lining 62 during processing. Specifically, lining 62 can be calibrated such that by knowing the temperature of the lining, the temperature of the wafers inside the lining can be estimated. In this embodiment, temperature sensing devices are required that sense the temperature of lining 62. For example, as shown in FIG. 4, a radiation sensing device 30 can be used to monitor the temperature of lining 62 and/or a thermocouple 60 can also be built into the lining for providing temperature information. Radiation sensing device 30 and thermocouple 60 can be connected to a controller which can be designed to then determine the temperature of wafers 14 based on the temperature information that is received.

Figure 5:
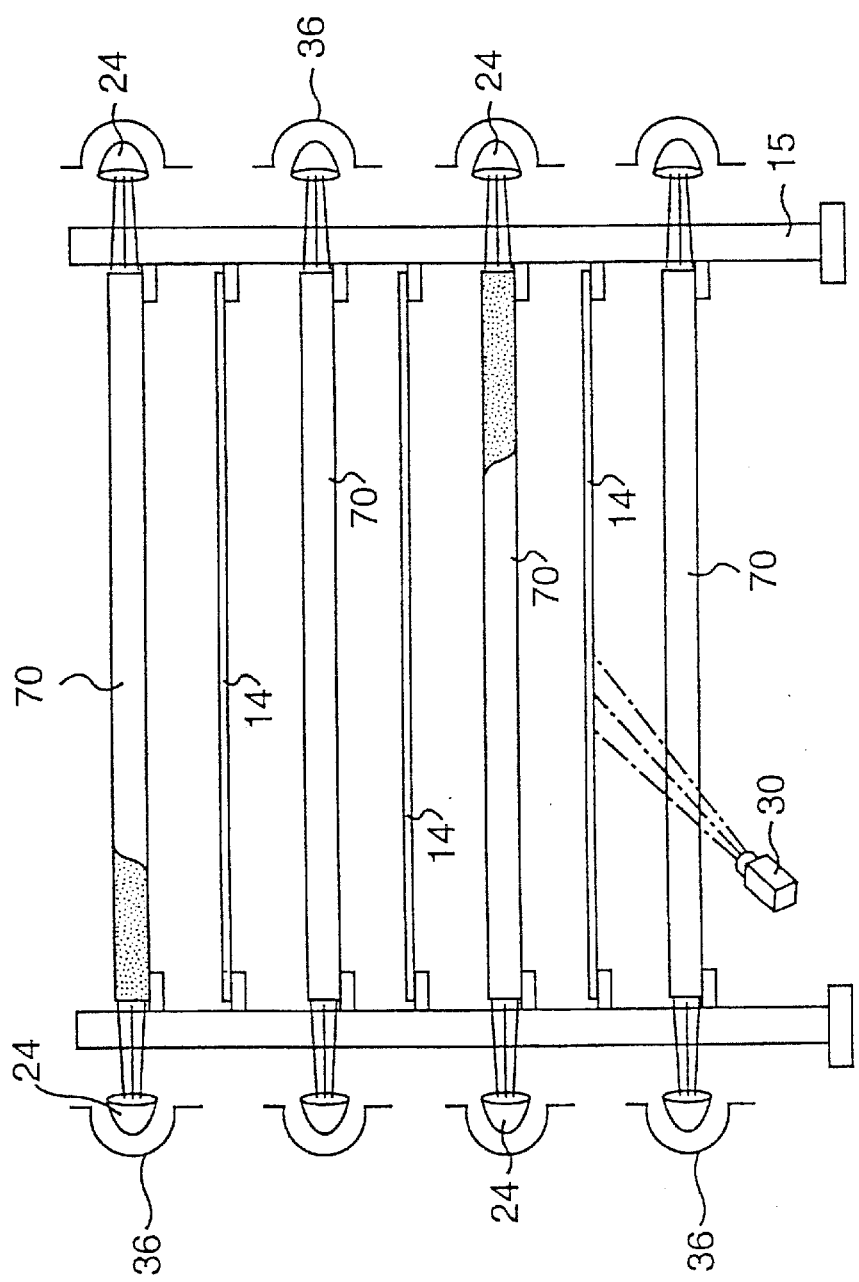
FIG. 5 is a cross-sectional view of a further alternative embodiment of a thermal processing system made in accordance with the present invention.
Figure 6:
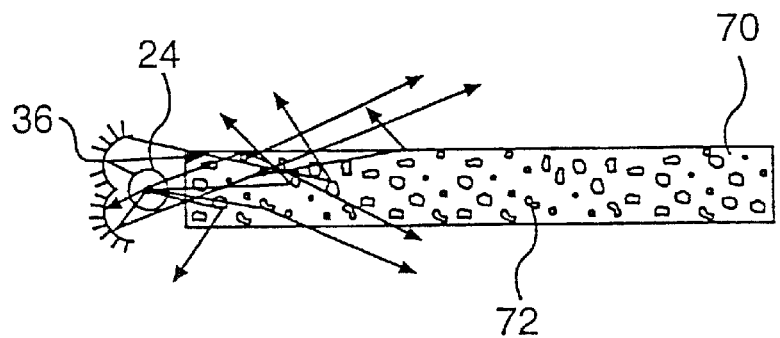
FIG. 6 is a cross-sectional view of a lamp and an energy dispersing member which may be used in the thermal processing system illustrated in FIG. 5.
Figure 7:
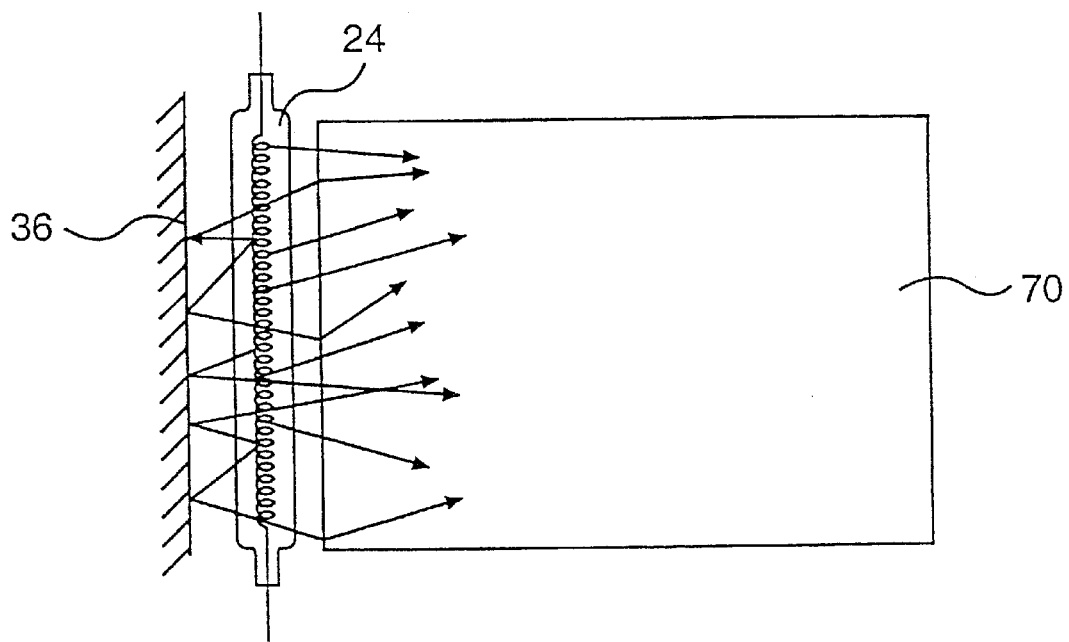
FIG. 7 is a top view of the lamp and energy dispersing member illustrated in FIG. 6.

Referring to FIG. 5, FIG. 6 and FIG. 7, a further alternative embodiment of a heating system made in accordance with the present invention is illustrated. In this embodiment, energy dispersing members 70 are placed within the thermal processing chamber adjacent to wafers 14. In particular, energy dispersing members 70 are placed in between adjacent wafers. Energy dispersing members 70 are designed to receive light energy from lamps 24 and to refract and disperse the light energy onto the wafers in order to heat the wafers uniformly.

As described above, one of the objectives of the present invention is to ensure that light energy reaches and contacts each of the wafers contained on substrate holder 15. Thus, in FIG. 1, the wafers are spaced a determined distance apart. In this embodiment, on the other hand, energy dispersing members 70 are specifically included to ensure that the entire top surface and bottom surface of the wafers are being contacted by light energy and being heated during the process.

As shown in FIG. 5, preferably one or more lamps 24 are positioned around the perimeter or periphery of energy dispersing members 70 for shining light energy into the sides of the energy dispersing members. Reflectors 36 can also be provided for directing and focusing the light energy being emitted by lamps 24 directly into energy dispersing members 70. As particularly shown in FIGS. 6 and 7, light energy entering energy dispersing members 70 is then refracted and dispersed in multiple directions.

Energy dispersing members 70 can be made from various materials and can have various shapes. In one embodiment, for example, energy dispersing members 70 comprise quartz plates containing areas having a different index of refraction 72 than the quartz material itself as shown in FIG. 6. Areas 72 having a different index of refraction can be, for instance, glass particles, such as glass spheres, or air bubbles.

Alternatively, energy dispersing members 70 can be made from a substantially transparent material, such as quartz, that is shaped to refract and reflect the light energy as desired. For instance, sharp angles can be formed into the quartz plate that cause light energy entering the plate be directed towards the semiconductor wafers 14.

In still another alternative embodiment, energy dispersing members 70 can embody glass spheres in paste using screen printing and high temperature fusing. For instance, a transparent substrate made from a material such as quartz can be screen printed with a paste that contains glass particles, such as spheres, and a glass frit material. The paste can be screen printed on the substrate. Once the paste is applied to the substrate, the substrate can then be heated in order to drive off any organic binders and in order to form a heat resistant coating on the substrate capable of uniformly dispersing light energy contacting the substrate. In this embodiment, the paste can be screen printed onto the substrate according to any particular design or pattern in order to control the light scattering properties of the final product.

In any of the above embodiments, energy dispersing members 70 can be made to disperse light according to a desired and predetermined pattern. For instance, in order to ensure that wafers 14 are being heated uniformly, energy dispersing members 70 can be designed so that more light energy is contacting the wafers at the perimeter where typically more heat is needed in order to compensate for energy losses at the edges of the wafer. It should be understood, however, that any desired or predetermined spectral pattern can be created in accordance with the present invention.

As shown in FIG. 5, in this embodiment, the system includes a radiation sensing device 30 for determining the temperature of wafers 14 during processing. In general, in order to determine the temperature of wafers 14 during processing, the same type of temperature measurement devices illustrated in FIG. 1 may be used.

Lamps 24 that can be used in the embodiment illustrated in FIG. 5 can vary depending upon the particular application. For instance, elongated lamps as shown in FIG. 7 may be used or, alternatively, instead of one elongated lamp, the system can include a row of short upright lamps. Preferably, lamps are positioned to completely surround energy dispersing members 70. In general, lamps 24 surrounding energy dispersing members 70 should emit enough light energy so that each surface of the wafer is contacted with at least 6 watts/cm$^2$ of power.

Calculations thus far show that using a lamp output of about 200 watts per linear inch results in an overall power output from a quartz dispersing plate of from about 90 to about 120 watts per inch of lamp. If energy dispersing members 70 are plates having a dimension of 10"×10"×0.6" and if four 10" elongated lamps are placed adjacent to the plate, the plate and lamps will result in an output power density on a wafer surface of from about 5 to about 8 watts/cm$^2$.

The system of the present invention as shown in FIG. 5 can be used for various processes and is particularly well suited for low temperature applications. For instance, the system is well suited for copper annealing, copper reflow, low K dielectric annealing, aluminum sintering, besides various other processes. The system can also be used for deposition processes using proper gases in combination with the heating sources to deposit low and high K materials, dielectric materials and the like.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A multiwafer thermal processing system comprising:
a cold wall thermal processing chamber defining a plurality of walls, the processing chamber including a cooling system for actively cooling at least one wall, the cooling system comprising at least one cooling conduit placed adjacent to a wall of the thermal processing chamber, the cooling conduit being configured to circulate a cooling fluid adjacent to the wall, the chamber defining a vertical axis and being adapted to receive a plurality of stacked semiconductor wafers disposed about said vertical axis of said chamber, each of said semiconductor wafers having a top surface and a bottom surface;
a plurality of light energy sources in communication with said thermal processing chamber for heating semiconductor wafers contained in said chamber, said plurality of light energy sources encircling said vertical axis of said thermal processing chamber; and
a substrate holder contained within said thermal processing chamber, said substrate holder being configured to hold said plurality of semiconductor wafers, said wafers being held in a stacked arrangement wherein adjacent wafers are spaced a distance sufficient for light energy being emitted by said plurality of light energy sources to contact the top and bottom surfaces of said wafers.

2. The system as defined in claim 1, comprising at least one temperature sensing device for monitoring the temperature of said semiconductor wafers; and a controller in communication with said at least one temperature sensing device and said light energy sources, said controller being configured to control the amount of light energy being emitted by said light energy sources in response to temperature information received from said at least one temperature sensing device.

3. The system as defined in claim 1, when said semiconductor wafers held on said substrate holder are positioned substantially parallel to each other.

4. The system as defined in claim 1, wherein said system contains a plurality of light energy sources sufficient to heat said plurality of semiconductor wafers to a temperature of at least 800° C. in less than about five minutes.

5. The system as defined in claim 1, wherein the thermal processing system includes an interior sealed area defining at least one window, said light energy sources being located outside said interior area but inside the walls of the thermal processing chamber.

6. The system as defined in claim 1, wherein said thermal processing chamber includes a top and a bottom and wherein light energy sources are disposed at the top and bottom of said chamber.

7. The system as defined in claim 2, wherein said at least one temperature sensing device comprises a pyrometer.

8. The system as defined in claim 2, wherein at least one temperature sensing device comprises a thermocouple.

9. The system as defined in claim 6, wherein said light energy sources comprise lamps having an elongated housing, said lamps being positioned such that said elongated housing faces said substrate holder.

10. The system as defined in claim 9, wherein said light energy sources that encircle said vertical axis are positioned parallel to said vertical axis of said thermal processing chamber.

11. The system as defined in claim 9, wherein said light energy sources that encircle said vertical axis are positioned substantially perpendicular to said vertical axis of said thermal processing chamber.

12. The system as defined in claim 2, further comprising a gas inlet and a gas outlet in communication with said thermal processing chamber for circulating gases therethrough.

13. The system as defined in claim 1, wherein said light energy sources comprise tungsten-halogen lamps.

14. The system as defined in claim 1, wherein said cooling system maintains said thermal processing chamber at a constant temperature during wafer processing.

15. The system as defined in claim 1, when said adjacent wafers are spaced a distance sufficient for light energy to contact the entire top and entire bottom surfaces of said wafers.

16. A multiwafer thermal processing system comprising:
a cold wall thermal processing chamber including a cooling system for actively cooling the chamber, the cooling system comprising at least one cooling conduit placed adjacent to the chamber, the cooling conduit being configured to circulate a cooling fluid adjacent the chamber, the chamber adapted to receive semiconductor wafers;
a substrate holder contained within said thermal processing chamber, said substrate holder being configured to hold a plurality of semiconductor wafers, said wafers being held in a stacked arrangement wherein adjacent wafers are spaced apart a determined distance;
a lining included in said chamber and being positioned so as to surround said semiconductor wafers held on said substrate holder, said lining being made from a thermally conductive material; and
a plurality of light energy sources surrounding said thermal processing chamber, said light energy sources being positioned so as to heat said lining, wherein by heating said lining, said lining in turn heats said plurality of semiconductor wafers held on said substrate holder.

17. The system as defined in claim 16, further comprising at least one temperature sensing device for monitoring the temperature of said lining; and a controller in communication with said at least one temperature sensing device and said light energy sources, said controller being configured to control the amount of light energy being emitted by the light energy sources in response to temperature information received from said at least one temperature sensing device.

18. The system as defined in claim 16, wherein said lining is made from a material comprising silicon carbide or a polysilicon material.

19. The system as defined in claim 16, wherein said lining comprises a cylindrical sleeve.

20. The system as defined in claim 19, wherein said lining further includes a top and a bottom associated with said cylindrical sleeve for completely enclosing said substrate holder.

21. The system as defined in claim 20, wherein said plurality of light energy sources encircle said cylindrical sleeve.

22. The system as defined in claim 21, wherein said light energy sources comprise lamps having an elongated housing, said lamps being positioned such that said elongated housing faces said cylindrical sleeve.

23. The system as defined in claim 22, wherein said elongated housing of each of said lamps is positioned parallel to said cylindrical sleeve.

24. The system as defined in claim 22, wherein said elongated housing of each of said lamps is positioned perpendicular to the axis of said cylindrical sleeve.

25. The system as defined in claim 21, wherein said light energy sources are associated with reflectors that direct light being emitted by said light energy sources onto said cylindrical sleeve.

26. The system as defined in claim 16, further comprising a gas inlet and a gas outlet in communication with said thermal processing chamber for circulating gases therethrough.

27. The system as defined in claim 16, wherein said cooling system maintains said chamber at a constant temperature during wafer processing.

28. The system as defined in claim 16, wherein the light energy sources comprise tungsten-halogen lamps.

29. A multiwafer thermal processing system comprising:
   a cold wall thermal processing chamber adapted to receive semiconductor wafers;
   a cooling system for actively cooling the chamber;
   a substrate holder contained within said thermal processing chamber, said substrate holder being configured to hold a plurality of semiconductor wafers, said wafers being held in a stacked arrangement wherein adjacent wafers are spaced apart a determined distance;
   a plurality of energy dispersing members positioned within said thermal processing chamber so as to be placed adjacent said semiconductor wafers held on said substrate holder, the energy dispersing members being made from a material comprising a substantially transparent material;
   a lining being positioned so as to surround said semiconductor wafers held on said substrate holder, said lining being made from a thermally conductive material; and
   a plurality of light energy sources surrounding said lining of said thermal processing chamber for indirectly heating said semiconductor wafers, said light energy sources being positioned so as to heat said lining, wherein by heating said lining, said lining in turn heats said plurality of semiconductor wafers held on said substrate holder.

30. A system as defined in claim 29, wherein said energy dispersing members are placed in between adjacent semiconductor wafers held on said substrate holder.

31. A system as defined in claim 29, wherein at least one of said energy dispersing members is made from quartz.

32. A system as defined in claim 29, further comprising a gas inlet and a gas outlet in communication with said thermal processing chamber for circulating gases therethrough.

33. A system as defined in claim 29, further comprising:
   at least one temperature sensing device for monitoring the temperature of said lining; and
   a controller in communication with said at least one temperature sensing device and said light energy sources, said controller being configured to control the amount of light energy being emitted by the light energy sources in response to temperature information received from said at least one temperature sensing device.

34. A system as defined in claim 29, wherein said lining is made from a material comprising silicon carbide or a polysilicon material.

35. A system as defined in claim 29, wherein said lining comprises a cylindrical sleeve.

36. A system as defined in claim 33, wherein said lining further includes a top and a bottom associated with said cylindrical sleeve for completely enclosing said substrate holder.

37. A system as defined in claim 35, wherein said plurality of light energy sources encircle said cylindrical sleeve.

38. A system as defined in claim 35, wherein said light energy sources comprise lamps having an elongated housing, said lamps being positioned such that said elongated housing faces said cylindrical sleeve.

39. A system as defined in claim 38, wherein said elongated housing of each of said lamps is positioned parallel to said cylindrical sleeve.

40. A system as defined in claim 38, wherein said elongated housing of each of said lamps is positioned perpendicular to said cylindrical sleeve.

* * * * *